(12) United States Patent
Scheuerlein et al.

(10) Patent No.: US 8,679,967 B2
(45) Date of Patent: Mar. 25, 2014

(54) APPARATUS AND METHODS OF FORMING MEMORY LINES AND STRUCTURES USING DOUBLE SIDEWALL PATTERNING FOR FOUR TIMES HALF PITCH RELIEF PATTERNING

(75) Inventors: Roy E. Scheuerlein, Cupertino, CA (US); Yoichiro Tanaka, Nagoyashi Aichi (JP)

(73) Assignee: SanDisk 3D LLC, Milpitas, CA (US)

( * ) Notice: Subject to any disclaimer, the term of this patent is extended or adjusted under 35 U.S.C. 154(b) by 307 days.

(21) Appl. No.: 12/911,887

(22) Filed: Oct. 26, 2010

(65) Prior Publication Data

US 2011/0095434 A1 Apr. 28, 2011

Related U.S. Application Data

(60) Provisional application No. 61/255,080, filed on Oct. 26, 2009, provisional application No. 61/255,085, filed on Oct. 26, 2009.

(51) Int. Cl.
*H01L 21/4763* (2006.01)

(52) U.S. Cl.
USPC ........... 438/631; 438/622; 438/623; 438/624; 438/625; 438/626

(58) Field of Classification Search
USPC .................. 438/622, 623, 624, 625, 626, 631
See application file for complete search history.

(56) References Cited

U.S. PATENT DOCUMENTS

| | | |
|---|---|---|
| 5,915,167 A | 6/1999 | Leedy |
| 5,977,638 A | 11/1999 | Rodgers et al. |
| 6,952,030 B2 | 10/2005 | Herner et al. |
| 7,405,465 B2 | 7/2008 | Herner |
| 7,767,499 B2 | 8/2010 | Herner |
| 2004/0235309 A1 | 11/2004 | Hsu |
| 2005/0127519 A1 | 6/2005 | Scheuerlein et al. |
| 2005/0179134 A1 | 8/2005 | Matsubara |
| 2005/0245008 A1 | 11/2005 | Doris et al. |
| 2006/0154463 A1 | 7/2006 | Furukawa et al. |
| 2006/0250836 A1 | 11/2006 | Herner et al. |
| 2006/0263699 A1 | 11/2006 | Abatchev et al. |
| 2007/0049011 A1 | 3/2007 | Tran |
| 2007/0138535 A1 | 6/2007 | Higashitani |

(Continued)

FOREIGN PATENT DOCUMENTS

| | | |
|---|---|---|
| WO | WO 2008/008630 | 1/2008 |
| WO | WO 2009/101878 | 8/2009 |

OTHER PUBLICATIONS

U.S. Appl. No. 12/911,900, filed Oct. 26, 2010.
U.S. Appl. No. 12/911,944, filed Oct. 26, 2010.

(Continued)

*Primary Examiner* — Michael Lebentritt
*Assistant Examiner* — Aaron Dehne
(74) *Attorney, Agent, or Firm* — Dugan & Dugan, PC

(57) ABSTRACT

The present invention provides apparatus, methods, and systems for fabricating memory lines and structures using double sidewall patterning for four times half pitch relief patterning. The invention includes forming features from a first template layer disposed above a substrate, forming half-pitch sidewall spacers adjacent the features, forming smaller features in a second template layer by using the half-pitch sidewall spacers as a hardmask, forming quarter-pitch sidewall spacers adjacent the smaller features, and forming conductor features from a conductor layer by using the quarter-pitch sidewall spacers as a hardmask. Numerous additional aspects are disclosed.

20 Claims, 18 Drawing Sheets

(56) References Cited

U.S. PATENT DOCUMENTS

| | | |
|---|---|---|
| 2007/0205443 A1 | 9/2007 | Juengling |
| 2007/0215874 A1 | 9/2007 | Furukawa et al. |
| 2007/0228498 A1 | 10/2007 | Toba et al. |
| 2008/0017996 A1 | 1/2008 | Sato et al. |
| 2008/0171406 A1 | 7/2008 | Orimoto et al. |
| 2008/0318381 A1* | 12/2008 | Matamis et al. .............. 438/264 |
| 2009/0075485 A1 | 3/2009 | Ban et al. |
| 2009/0087990 A1 | 4/2009 | Yatsuda et al. |
| 2009/0166682 A1 | 7/2009 | Scheuerlein |
| 2009/0168480 A1 | 7/2009 | Scheuerlein et al. |
| 2009/0200583 A1 | 8/2009 | Marokkey et al. |
| 2009/0202952 A1 | 8/2009 | Abraham et al. |
| 2009/0263749 A1 | 10/2009 | Sim et al. |
| 2009/0302472 A1 | 12/2009 | Yoon |

OTHER PUBLICATIONS

International Search Report and Written Opinion of related International Application No. PCT/US2010/054017 dated Oct. 17, 2011.

Communication of related European Application No. 10774374.2 dated Jun. 4, 2012.

Dec. 14, 2012 Response to Jun. 4, 2012 Communication of related European Application No. 10774374.2.

Communication of related European Application No. 10774374.2 dated Mar. 20, 2013.

\* cited by examiner

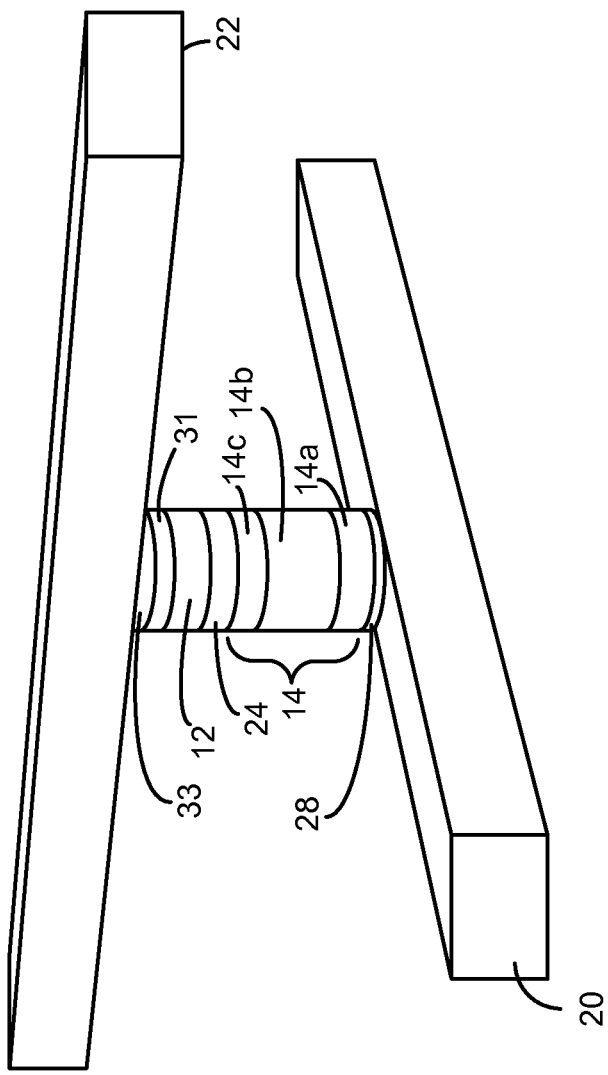

APPARATUS AND METHODS OF FORMING MEMORY LINES AND STRUCTURES USING DOUBLE SIDEWALL PATTERNING FOR FOUR TIMES HALF PITCH RELIEF PATTERNING

CROSS-REFERENCE TO RELATED APPLICATIONS

The present application claims priority to U.S. Provisional Patent Application No. 61/255,080, filed Oct. 26, 2009, entitled "DOUBLE SIDEWALL PATTERNING FOR 4× HALF PITCH RELIEF PATTERNING", which is hereby incorporated by reference in its entirety for all purposes. The present application also claims priority to U.S. Provisional Patent Application No. 61/255,085, filed Oct. 26, 2009, entitled "LAYOUT OF 3D MATRIX ARRAY MEMORY FOR REDUCED COST PATTERNING", which is hereby incorporated by reference in its entirety for all purposes.

The present application is also related to U.S. patent application Ser. No. 12/911,900, filed on Oct. 26, 2010, which is incorporated by reference herein in its entirety for all purposes.

The present application is also related to U.S. patent application Ser. No. 12/911,944 filed on Oct. 26, 2010, which is incorporated by reference herein in its entirety for all purposes.

FIELD OF THE INVENTION

The present invention relates to non-volatile memories, and more particularly to a method of forming memory lines and structures for memory cells by double sidewall patterning.

BACKGROUND

The fabrication of a memory device typically requires a number of steps including lithography, deposition of various constituent materials, patterning, etching, etc. However, the continual reduction in the size of individual memory elements, and the continual increase in the density with which such memory elements are fabricated on memory devices, are challenging the limits of current lithography and patterning technology. For example, existing lithography and patterning technology is typically not well suited for forming features having a pitch less than about 32 nanometers. Available techniques are relatively expensive and require expensive processes such as immersion lithography, extreme-ultraviolet lithography (EUVL), and/or electron beam (e-beam) direct writing lithography. Accordingly, improved and more cost effective methods of patterning memory cells for use in memory devices are desirable. In particular, methods and apparatus for forming memory elements having small pitch are desirable.

SUMMARY

In some embodiments, the present invention provides methods of forming a wiring pattern for a memory. The methods include forming first features from a first template layer disposed above a substrate; forming first sidewall spacers adjacent the first features; forming second features in a second template layer by using the first sidewall spacers as a hardmask; forming second sidewall spacers adjacent the second features; and forming conductor features from a conductor layer by using the second spacers as a hardmask.

In some other embodiments, the present invention provides a wiring pattern for a memory array. The wiring pattern includes a structure formed with first features formed from a first template layer disposed above a substrate, first sidewall spacers formed adjacent the first features, second features formed in a second template layer by using the first sidewall spacers as a hardmask, second sidewall spacers formed adjacent the second features, and conductor features formed from a conductor layer by using the second spacers as a hardmask.

In yet other embodiments, the present invention provides methods of forming a wiring pattern for a memory. The methods include forming first features from a first template layer disposed above a substrate; forming sidewall spacers adjacent the first features; forming second features in a second template layer by using the sidewall spacers as a hardmask; and forming conductor features by depositing conductive material on sidewalls of the second features.

In some other embodiments, the present invention provides a wiring pattern for a memory array. The wiring pattern includes a structure formed with first features formed from a first template layer disposed above a substrate, sidewall spacers formed adjacent the first features, second features formed in a second template layer by using the sidewall spacers as a hardmask, and conductor features formed by depositing conductive material on sidewalls of the second features.

Numerous additional embodiments are described below with respect to the following drawings.

BRIEF DESCRIPTION OF THE DRAWINGS

Features of the present invention can be more clearly understood from the following detailed description considered in conjunction with the following drawings, in which the same reference numerals denote the same elements throughout.

FIG. 2A is a simplified perspective view of an exemplary memory cell in accordance with embodiments of the present invention.

DETAILED DESCRIPTION

Figure 1:
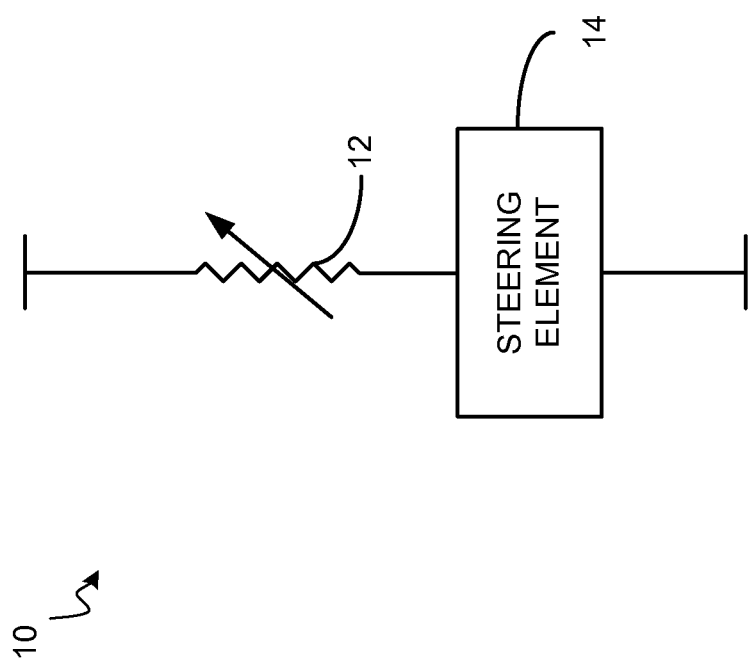
FIG. 1 is a diagram of an exemplary memory cell in accordance with embodiments of the present invention.

The present invention facilitates manufacturing cost reduction of submicron three dimensional memory arrays. In particular, the present invention provides methods that avoid having to use immersion lithography, EUVL, or e-beam direct write lithography methods (e.g., each of which are relatively expensive) to form memory array structures with a half-pitch (HP) dimension below approximately 30 nm.

In some embodiments of the present invention, methods are provided that can be used to reduce the half pitch dimension by 2× and in other embodiments, a 4× reduction in half pitch can be realized. Thus, using the double sidewall patterning methods of the present invention, cost efficient 32 nm lithography can be used to achieve memory structure (e.g., memory line) patterning down to an 8 nm half pitch dimension. Note that in terms of current technology, this improvement represents an extension of 32 nm lithography of five generations: from 32 nm to 22 nm to 16 nm to 11 nm to 8 nm. However, it will be understood that the present invention may be used to extend future technologies as well.

In an exemplary embodiment in accordance with the present invention, memory lines having a pitch smaller than the minimum pitch associated with available lithography technology (i.e., the "minimum pitch" without using EUVL or e-beam direct write lithography) is formed using double sidewall patterning. Initially, two template layers (e.g., $Si_3N_4$) are formed above a wiring layer (e.g., tungsten (W)) which has been deposited on an inter-layer dielectric (ILD) or substrate. An etch stop layer (e.g., $SiO_2$) may be deposited between the template layers, and optional adhesion layers may be deposited between the lower template layer and the wiring layer and between the wiring layer and the ILD.

In some embodiments, lines (or other features) are patterned in the first template layer using conventional lithography (e.g., 32 nm technology) having the minimum pitch commensurate with the available lithography and patterning technology. A sidewall hardmask is formed on the sides of the lines. The sidewall hardmask includes sidewall spacers on either side of the first template layer line structures. The sidewall hardmask has a pitch that is smaller than the minimum pitch of the original line pattern, e.g., approximately half the pitch of the original line pattern.

Next, the "half-pitch" sidewall hardmask is used to pattern the second template layer into half-pitch lines. A second sidewall hardmask is formed on the sides of the half-pitch template. This second sidewall hardmask also includes sidewall spacers on either side of the second template layer half-pitch lines and has a smaller pitch than the pitch of the "half-pitch" sidewall hardmask, e.g., approximately one quarter the pitch of the original line pattern. The "quarter-pitch" sidewall hardmask may then be used to form quarter pitch structures such as memory lines (e.g., bit and word lines) for a three dimensional memory array. A three dimensional matrix array may be formed using double sidewall patterning according to the present invention. In some embodiments, the matrix array includes a first set of memory lines parallel to a first axis of the array and a second set of memory lines parallel to a second axis of the array. The first and second sets of lines may be non-parallel (e.g., perpendicular) to one another.

FIG. 1 depicts a schematic illustration of an exemplary memory cell 10 in accordance with this invention. Memory cell 10 includes a reversible resistance switching element 12 coupled to a steering element 14. Reversible resistance switching element 12 includes a reversible resistivity switching material (not separately shown) having a resistivity that may be reversibly switched between two or more states.

For example, reversible resistivity switching material of element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, reversible resistance switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1", although more than two data/resistance states may be used. Numerous reversible resistivity switching materials and operation of memory cells employing reversible resistance switching elements are described, for example, in U.S. patent application Ser. No. 11/125,939, filed May 9, 2005 and titled "Rewriteable Memory Cell Comprising A Diode And A Resistance Switching Material" (the "'939 Application"), which is hereby incorporated by reference herein in its entirety for all purposes.

Steering element 14 may include a thin film transistor, a diode, metal-insulator-metal tunneling current device, or another similar steering element that exhibits non-ohmic conduction by selectively limiting the voltage across and/or the current flow through reversible resistance switching element 12. In this manner, memory cell 10 may be used as part of a two or three dimensional memory array and data may be written to and/or read from memory cell 10 without affecting the state of other memory cells in the array.

Exemplary embodiments of memory cell 10, reversible resistance switching element 12 and steering element 14 are described below with reference to FIGS. 2A-2D and FIG. 3.

FIG. 2A is a simplified perspective view of an exemplary embodiment of a memory cell 10 in accordance with this invention in which steering element 14 is a diode. Memory cell 10 includes a reversible resistance switching element 12 coupled in series with a diode 14 between a first conductor 20 and a second conductor 22. In some embodiments, a barrier layer 24 may be formed between reversible resistance switching element 12 and diode 14, and barrier layers 31 and 33 may be formed between reversible resistance switching element 12 and second conductor 22. An additional barrier layer 28 may be formed between diode 14 and first conductor 20. For example, barrier layers 24, 28, 31 and 33 may include titanium nitride, tantalum nitride, tungsten nitride, or another similar barrier layer material.

Diode 14 may include any suitable diode such as a vertical polycrystalline p-n or p-i-n diode, whether upward pointing with an n-region above a p-region of the diode or downward pointing with a p-region above an n-region of the diode. Exemplary embodiments of diode 14 are described below with reference to FIG. 3.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
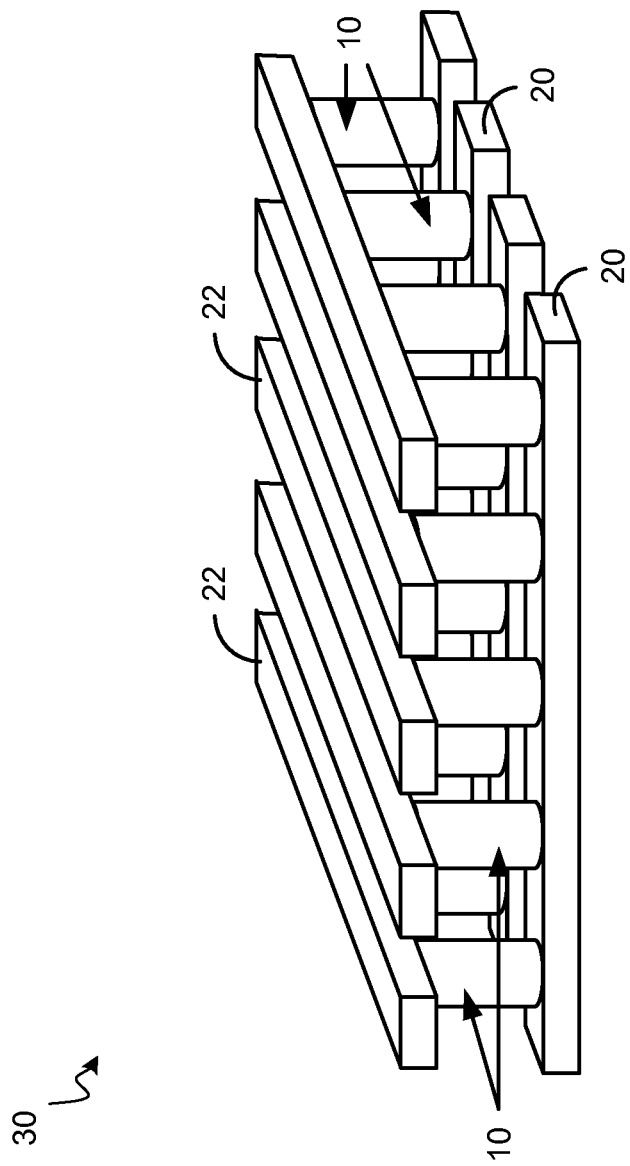
FIG. 2B is a simplified perspective view of a portion of a first exemplary memory level formed from a plurality of the memory cells of FIG. 2A.

FIG. 2B is a simplified perspective view of a portion of a first memory level 30 formed from a plurality of memory cells 10, such as memory cells 10 of FIG. 2A. For simplicity, reversible resistance switching element 12, diode 14, and barrier layers 24, 28, 31 and 33 are not separately shown. Memory array 30 is a "cross-point" array including a plurality of bit lines (second conductors 22) and word lines (first conductors 20) to which multiple memory cells are coupled (as shown). In the exemplary embodiment, first conductor 20 and second conductor 22 are regularly spaced at a pitch between about 16 nm and about 8 nm, more generally between about 22 nm and about 3 nm. Other memory array configurations may be used, as may multiple levels of memory.

Figure 2C:
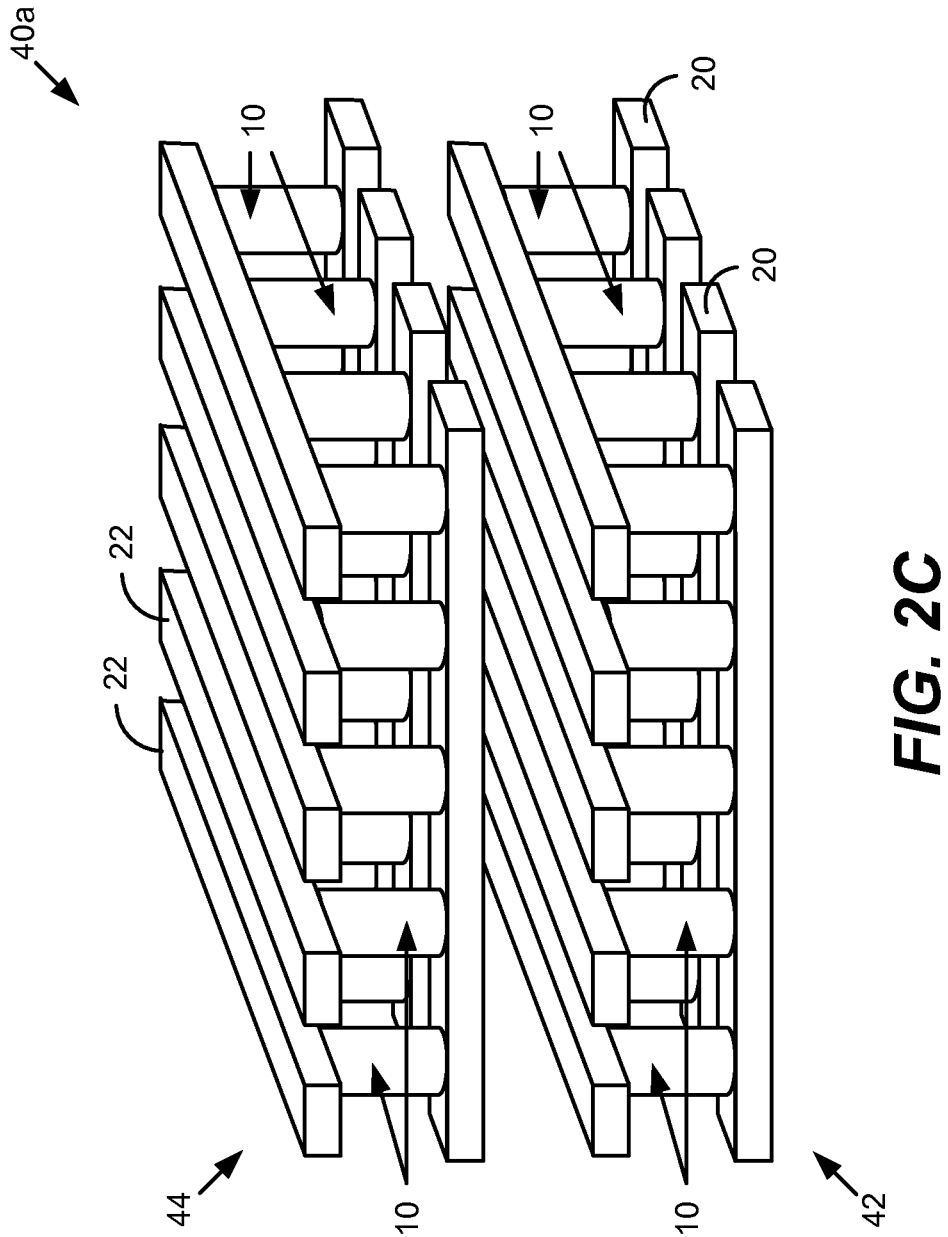
FIG. 2C is a simplified perspective view of a portion of a first exemplary three-dimensional memory array in accordance with embodiments of the present invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an inter-level dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
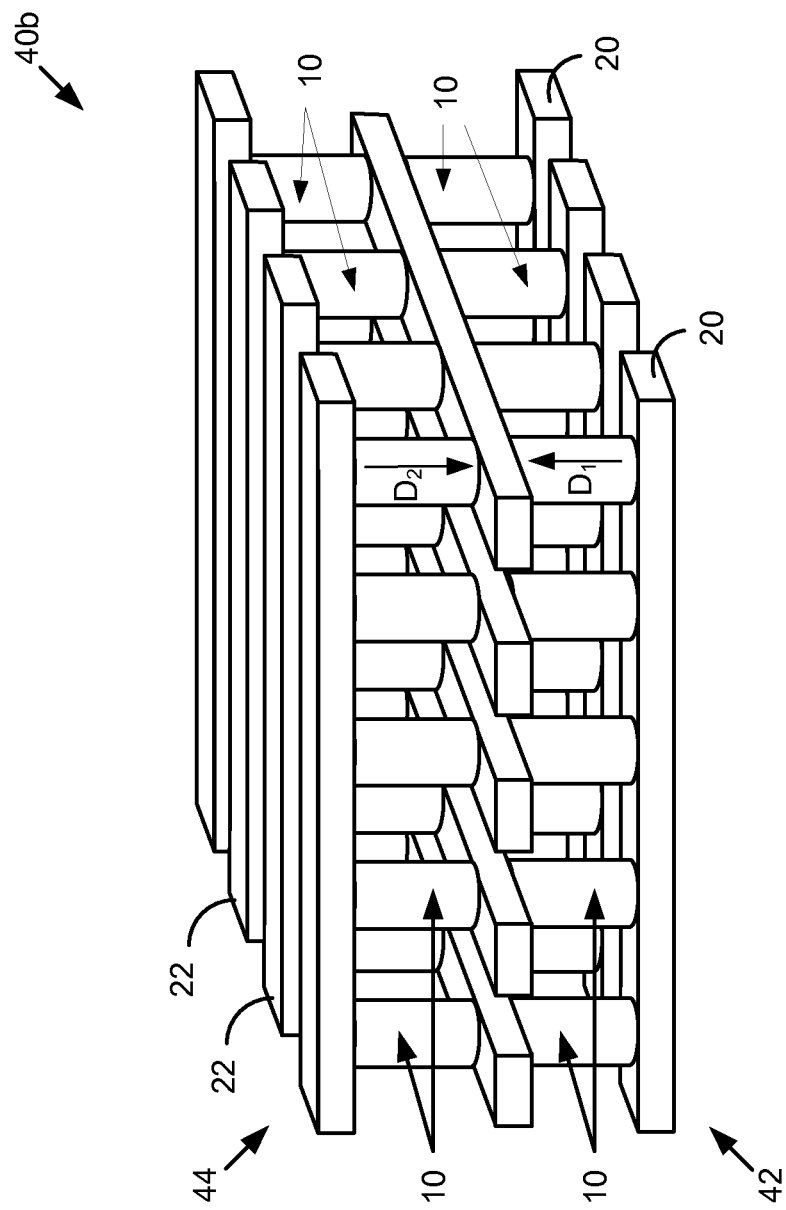
FIG. 2D is a simplified perspective view of a portion of a second exemplary three-dimensional memory array in accordance with embodiments of the present invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007 and titled "Large Array Of Upward Pointing P-I-N Diodes Having Large And Uniform Current" (the "'151 Application"), which is hereby incorporated by reference herein in its entirety for all purposes. For example, as shown in FIG. 2D, the diodes of the first memory level 42 may be upward pointing diodes as indicated by arrow D1 (e.g., with p regions at the bottom of the diodes), whereas the diodes of the second memory level 44 may be downward pointing diodes as indicated by arrow D2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3:
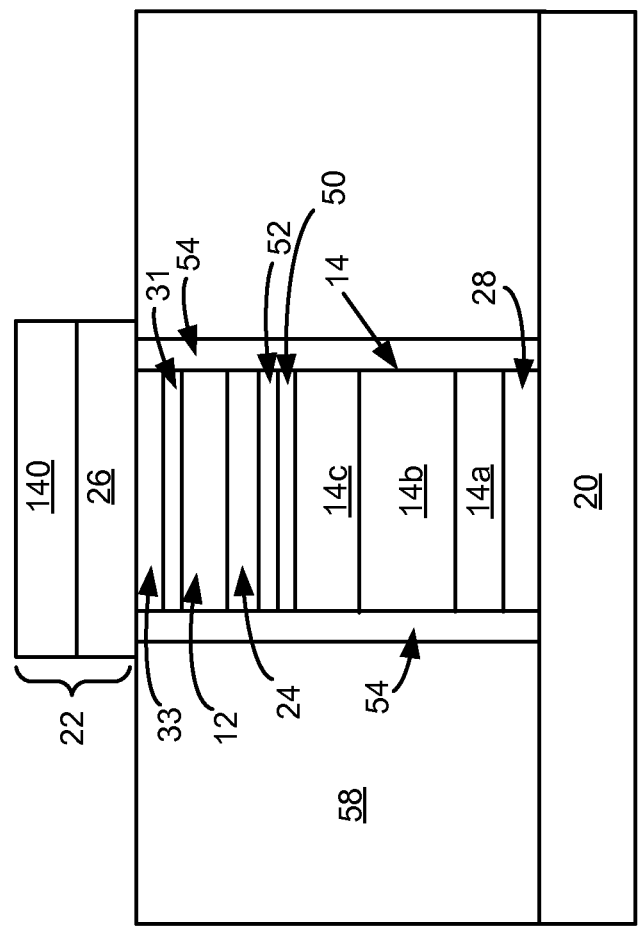
FIG. 3 is a cross-sectional view of an exemplary embodiment of a memory cell in accordance with embodiments of the present invention.

FIG. 3 is a cross-sectional view of an exemplary embodiment of memory cell 10 of FIG. 2A. In particular, memory cell 10 may include a carbon-based reversible resistance switching element 12 (referred to in the remaining description as "carbon layer 12"), diode 14, and first and second conductors 20 and 22, respectively. Memory cell 10 also may include barrier layers 24, 28, 31, and 33, a silicide layer 50, a silicide-forming metal layer 52, and dielectric layer 58, as well as adhesion layers, antireflective coating layers and/or the like (not shown) which may be used with first and/or second conductors 20 and 22, respectively, to improve device performance and/or facilitate device fabrication. Memory cell 10 also may include one or more sidewall liners 54.

As previously stated, diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes. In some embodiments, a few hundred angstroms or less of silicon-germanium alloy with about 10 at % or more of germanium may be employed.

Barrier layer 28, such as titanium nitride, tantalum nitride, tungsten nitride, or other similar barrier layer material, may be formed between first conductor 20 and n+ region 14a (e.g., to prevent and/or reduce migration of metal atoms into the polysilicon regions).

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14c.

Following formation of silicide-forming metal layer 52, an RTA step may be performed at about 540° C. for about one minute to form silicide layer 50, consuming all or a portion of the silicide-forming metal layer 52. Following the RTA step, any residual nitride layer from silicide-forming metal layer 52 may be stripped using a wet chemistry, as described above, and as is known in the art.

Barrier layer 24, including titanium nitride, tantalum nitride, tungsten nitride, or another similar barrier layer material, may be formed above silicide-forming metal layer 52.

Carbon layer 12 includes a carbon-based material. For example, carbon layer 12 may include amorphous carbon ("aC"). In other embodiments, carbon layer 12 may include graphene, graphite, carbon nano-tube materials, amorphous diamond-like carbon, etc.

Barrier layers 31 and 33, which may include titanium nitride, tantalum nitride, tungsten nitride, or another similar barrier layer material, may be formed above carbon layer 12.

Figure 4A:
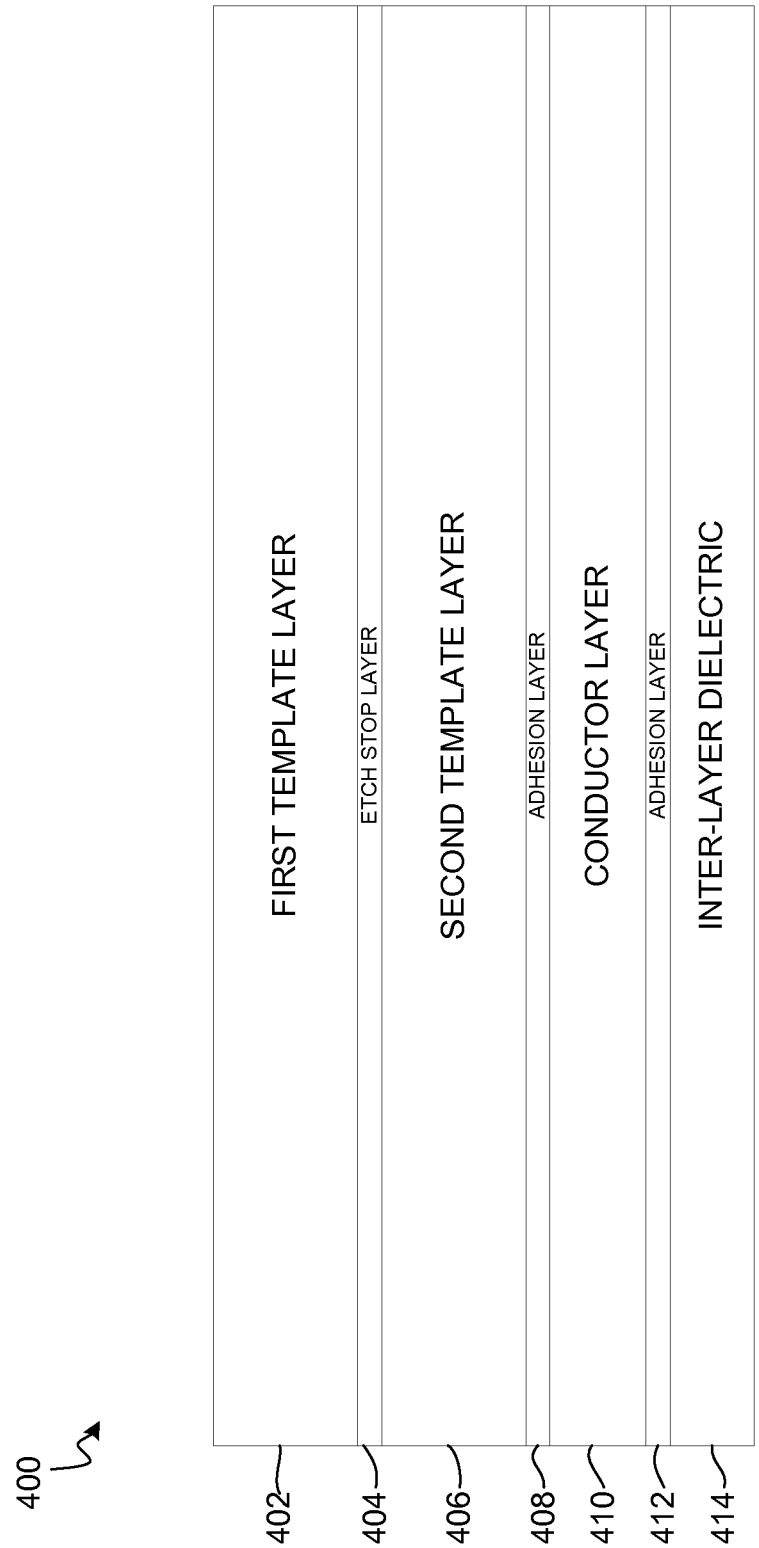
FIGS. 4A through 4F illustrate a first sequence of cross-sectional views of a portion of a substrate during an exemplary fabrication of a feature in accordance with embodiments of the present invention.

In accordance with exemplary embodiments of the invention, substantially parallel, substantially co-planar memory lines or rails are formed using a sequential sidewall patterning process depicted in FIGS. 4A to 4F. FIG. 4A depicts the cross-section of an example stack of layers 400 that may be used in the double sidewall patterning process of the present invention. As shown, a first template layer 402 is deposited on an etch stop layer 404. The etch stop layer 404 is on a second template layer 406 which is formed on either an optional adhesion layer 408 or directly on a conductive layer 410. The conductive layer 410 is formed on an adhesion layer 412 which is bound to an inter-layer dielectric 414. As indicated above, other memory and/or wiring layers may be formed above and below the layer stack 400.

The first and second template layers 402, 406 may be silicon nitride ($Si_3N_4$) or any practicable template material. These layers may be between approximately 50 nm and approximately 500 nm thick. The etch stop layer 404 may be silicon dioxide ($SiO_2$) or any practicable etch stop material and may be between approximately 10 nm and approximately 200 nm thick. The adhesion layers 408, 412 may be titanium nitride (TiN), tantalum nitride (TaN), tungsten nitride (WN) or any practicable adhesion material and may be between approximately 20 to approximately 500 angstroms, and preferably approximately 100 angstroms thick. Other adhesion layer materials and/or thicknesses may be employed. In some embodiments, adhesion layers 408, 412 may be optional.

Conductive layer 410 may include any suitable conductive material such as tungsten (W) or another appropriate metal, heavily doped semiconductor material, a conductive silicide, a conductive silicide-germanide, a conductive germanide, or any practicable wiring material deposited by any suitable method (e.g., chemical vapor deposition ("CVD"), physical vapor deposition ("PVD"), etc.). In at least one embodiment, conductive layer 106 may be approximately 200 to approximately 2500 angstroms of tungsten thick. Other conductive layer materials and/or thicknesses may be used.

Figure 4B:
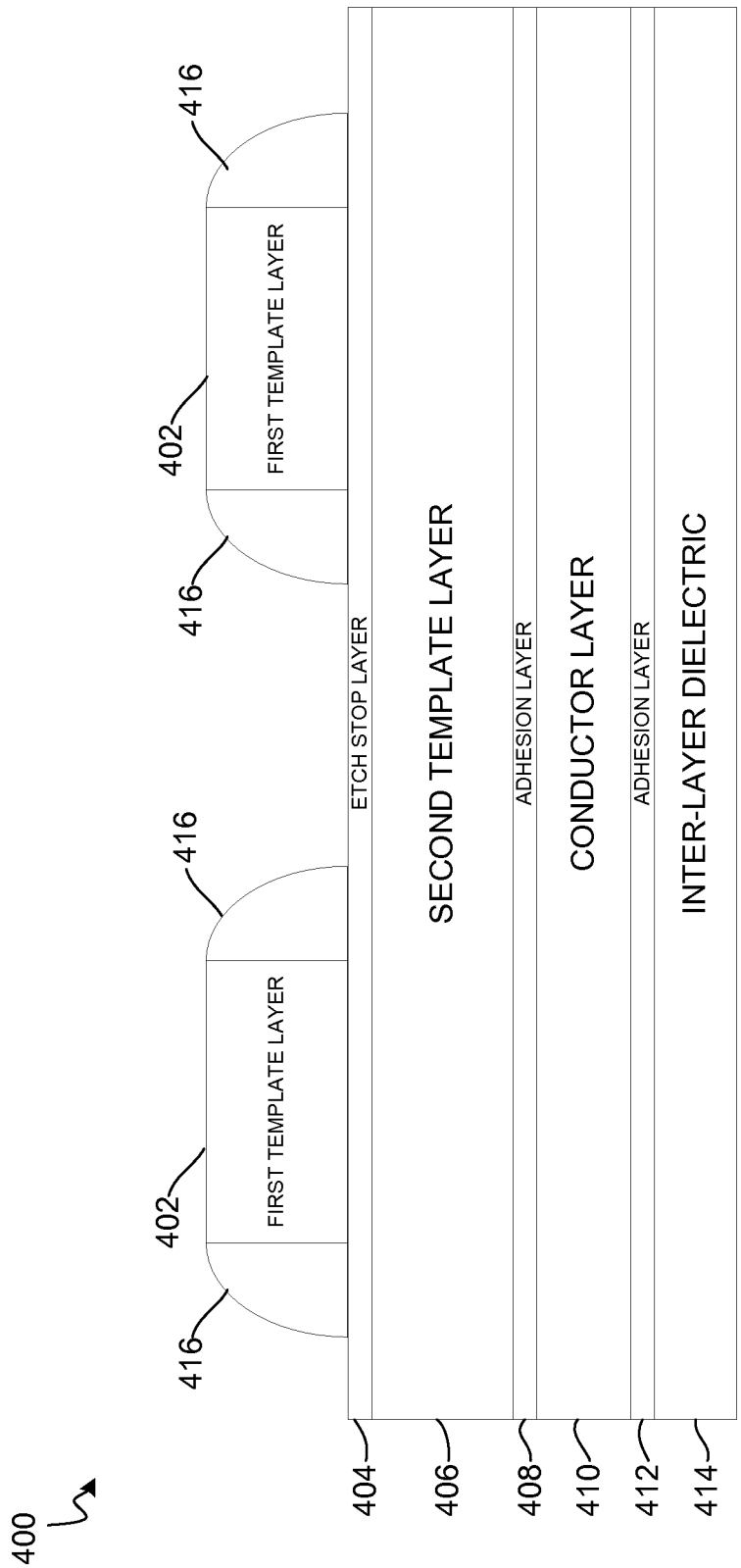
Figure 4C:
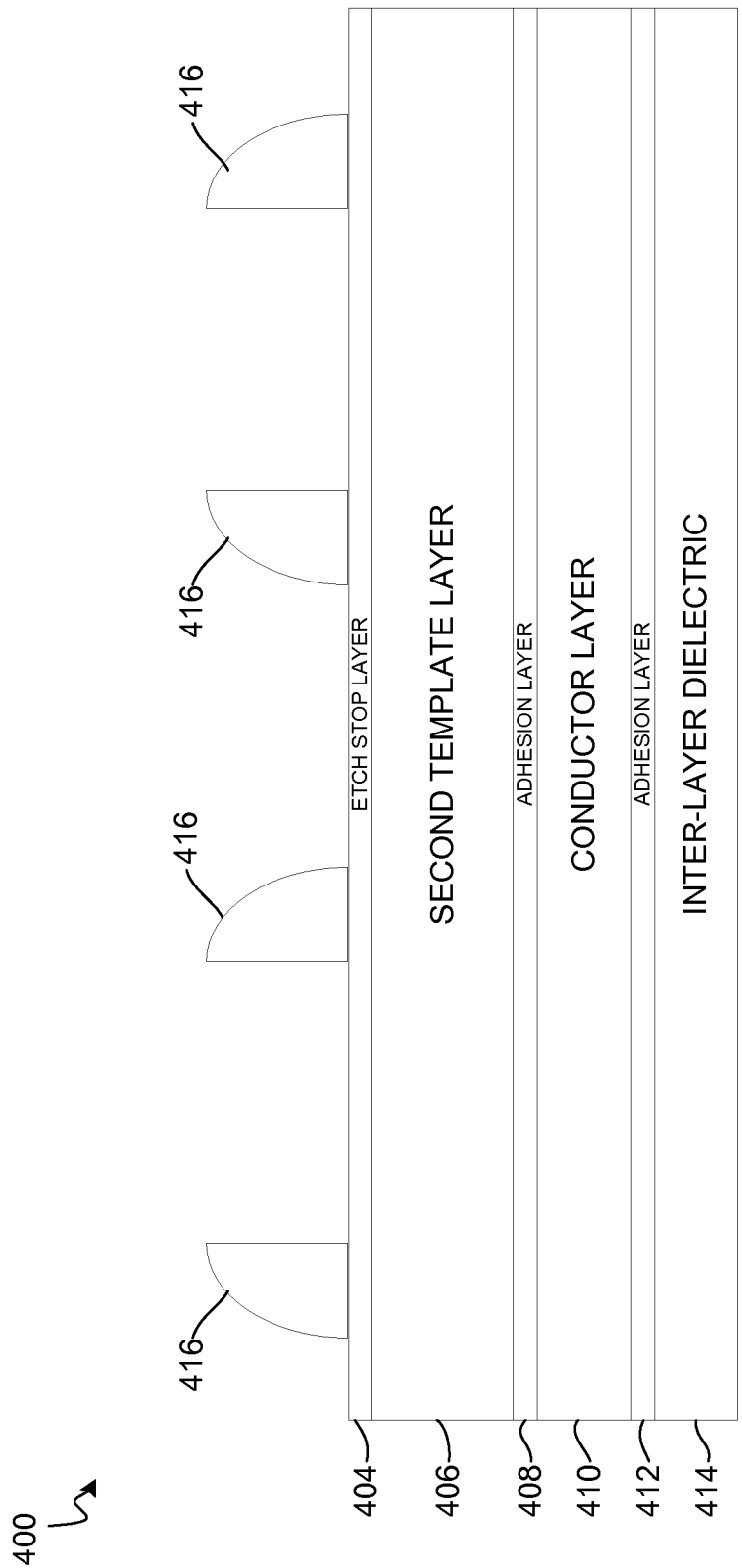

Turning to FIG. 4B, the first template layer 402 is patterned with rails/lines (or other features) using conventional lithography (e.g., 32 nm technology) having the minimum pitch commensurate with the available lithography and patterning technology. The line features shown in FIG. 4B extend into and out of the page, and are shown in cross-section. Next, by depositing a conformal liner of, for example, polysilicon and performing an isotropic etch step, a sidewall hardmask 416 is formed on the sides of the line features patterned in the first template layer 402. The resulting sidewall hardmask 416 includes sidewall spacers on either side of the first template layer 402 line features as shown in FIG. 4B. The sidewall hardmask 416 has a pitch that is smaller than the minimum pitch of the original line pattern, e.g., approximately half the pitch of the original line pattern. The sidewall spacers are separated by spaces having a width greater than one-half the minimum pitch. For example, the ratio of the width of the spaces to the width of the line features may be about 3:1. Polysilicon or any practicable material may be used to form the sidewall hardmask 416. A wet etch process may then be used to remove the remaining first template layer 402 (i.e., the line features) between the sidewall hardmask 416 spacers as shown in FIG. 4C. In some embodiments, the second template layer 406 may optionally be $SiO_2$ or have a similar etch rate ratio to the first template layer 402 so that an etch stop layer 404 is not necessary.

Figure 4D:
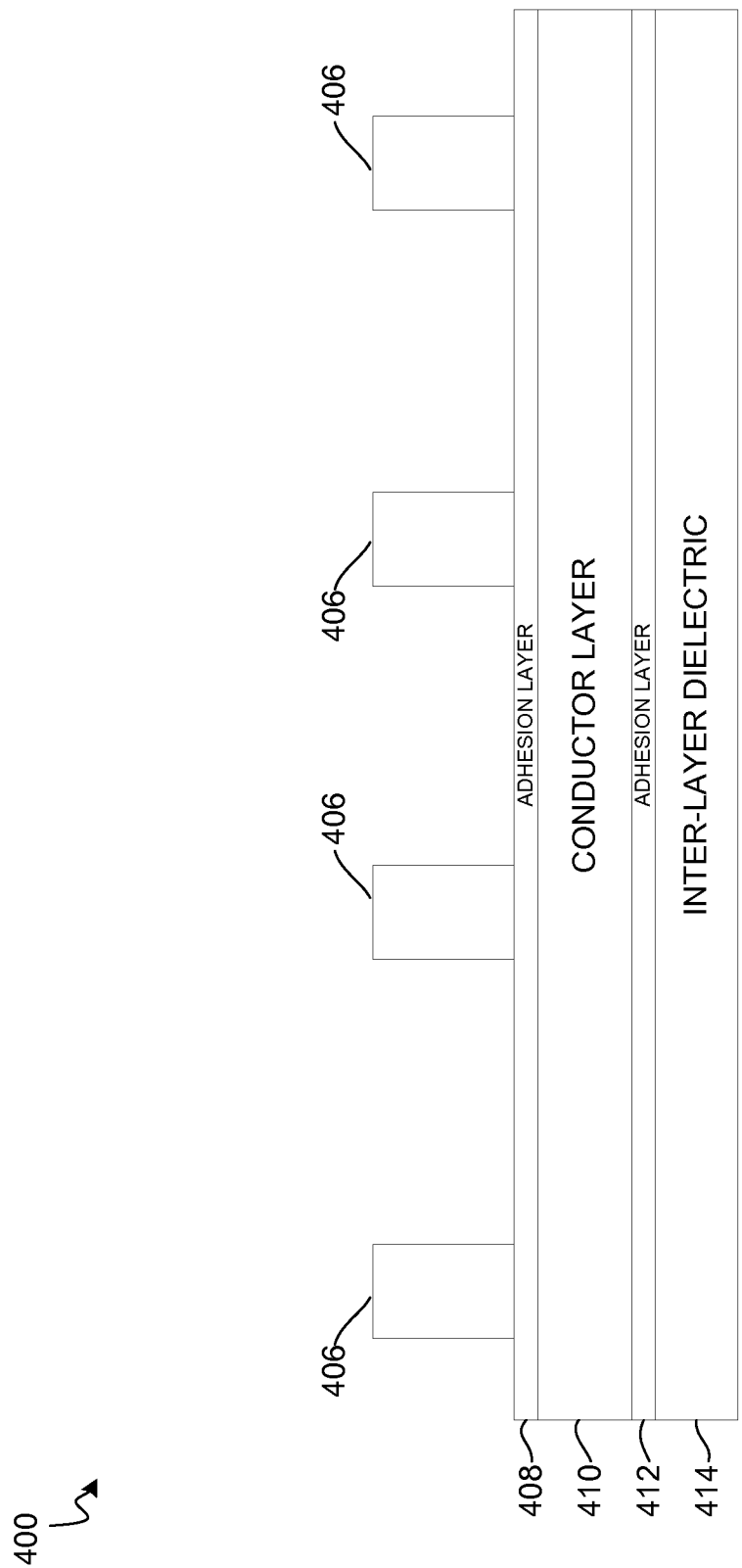
Figure 4E:
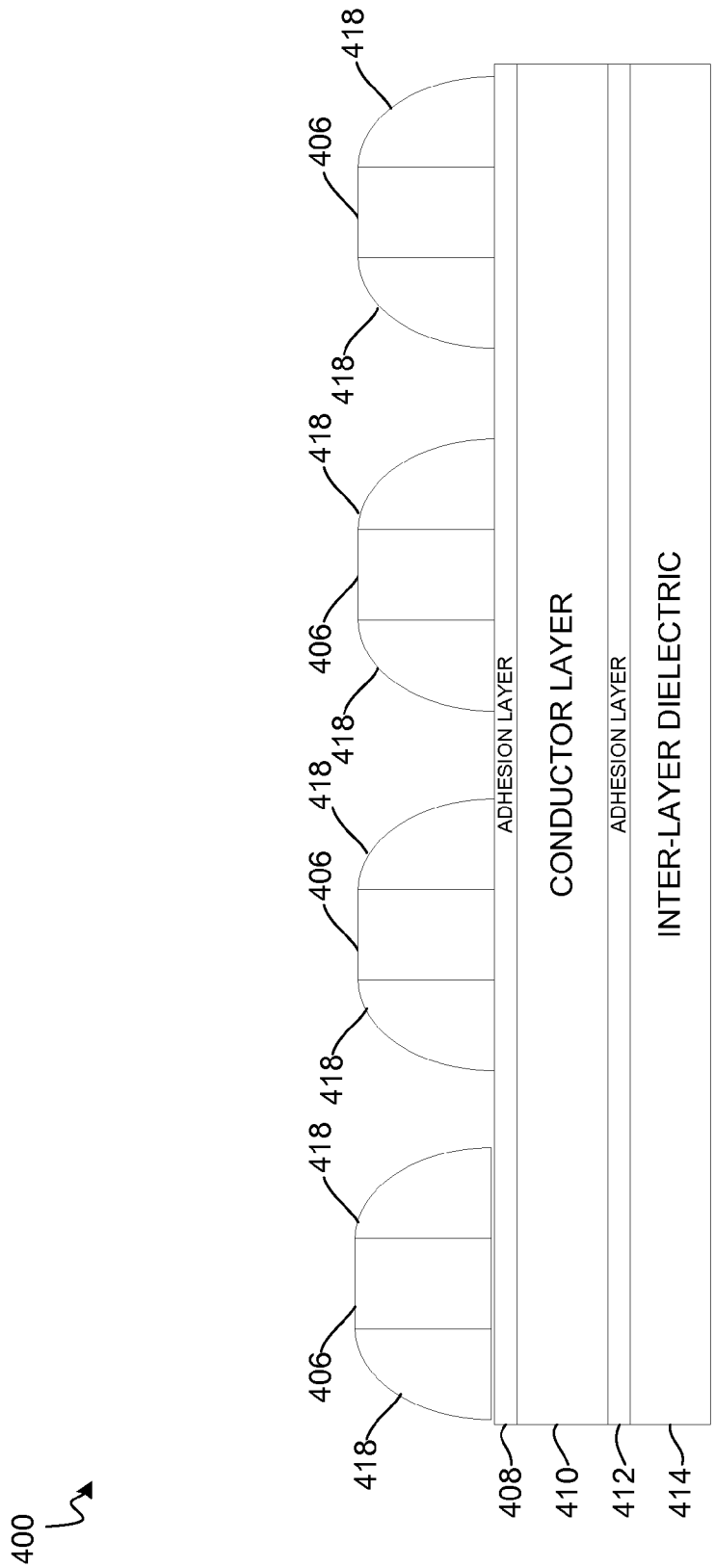

Next, the "half-pitch" sidewall hardmask 416 is used to pattern the second template layer 406 into half-pitch lines as shown in FIG. 4D. Once again by depositing a conformal liner and performing an isotropic etch step, a sidewall hardmask 418 is formed on the sides of the lines patterned in the second template layer 406. The resulting sidewall hardmask 418 includes sidewall spacers on either side of the second template layer 406 line structures as shown in FIG. 4E. This second sidewall hardmask 418 has a smaller pitch than the pitch of the "half-pitch" sidewall hardmask 416, e.g., approximately one-quarter the pitch of the original line pattern. A wet etch process may then be used to remove the remaining second template layer 406 between the sidewall hardmask 418.

Figure 4F:
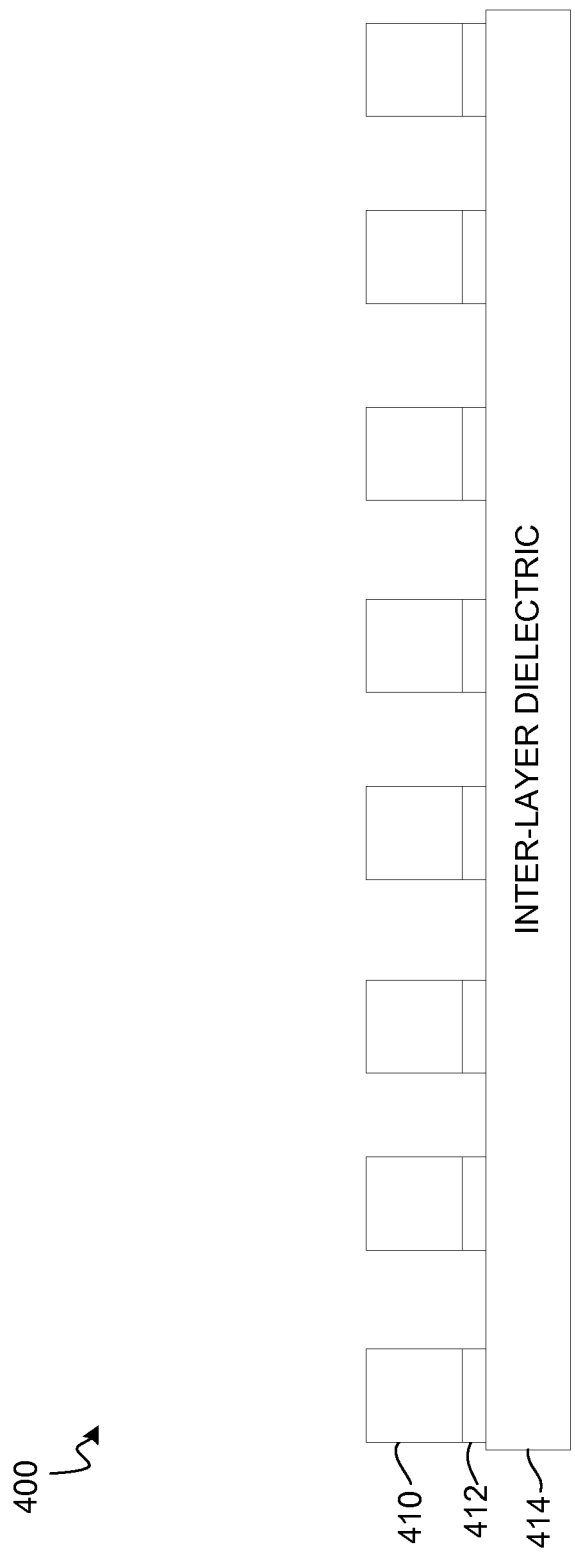

The "quarter-pitch" sidewall hardmask 418 may then be used to etch the conductor layer 410 to form quarter pitch structures such as memory lines (e.g., bit and word lines) as shown in FIG. 4F. A dielectric gap fill material $SiO_2$ may then be deposited and a planarization process may be used to level the four times HP relief patterned features. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 5A:
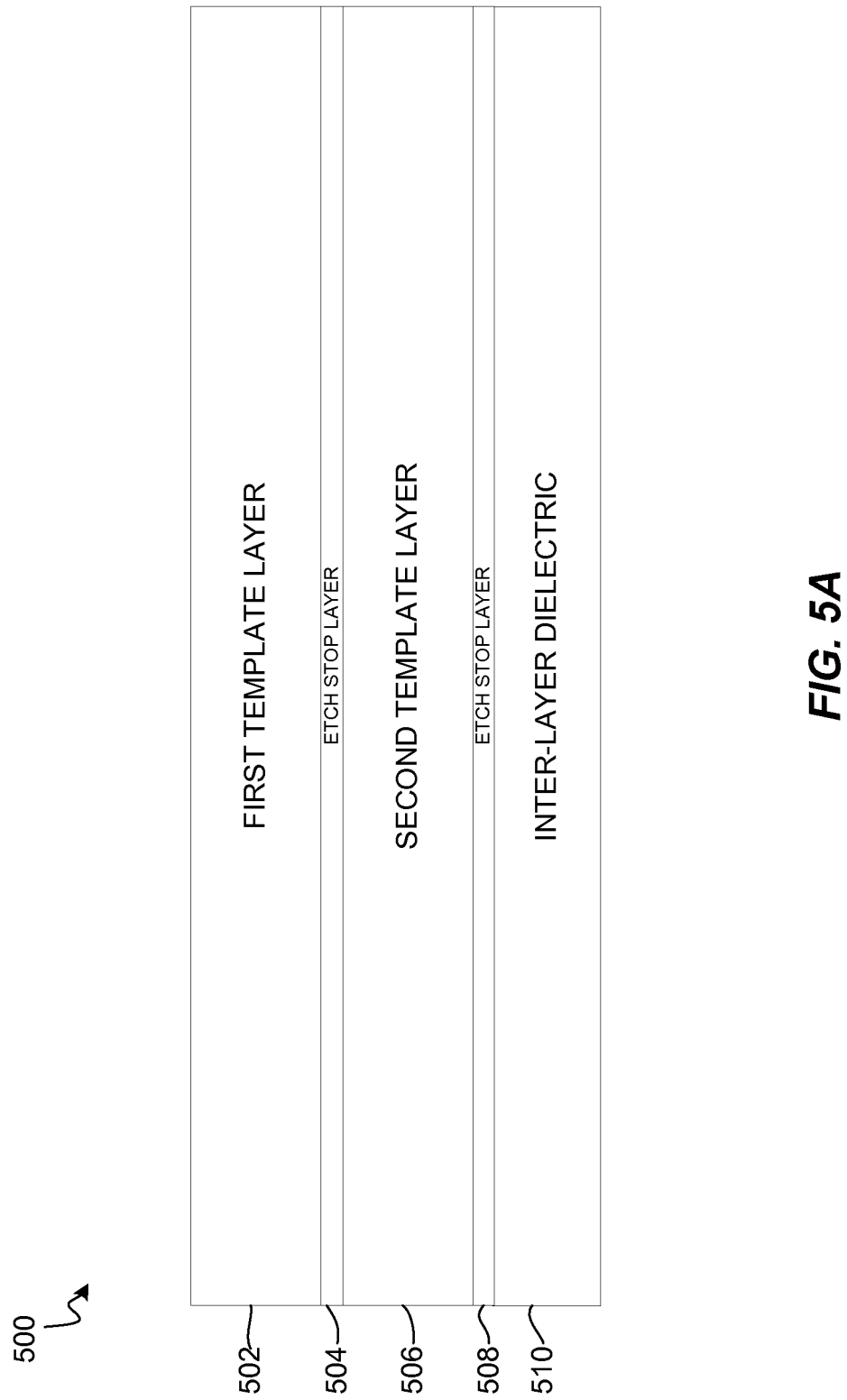
FIGS. 5A through 5F illustrate a second sequence of cross-sectional views of a portion of a substrate during an exemplary fabrication of a feature in accordance with embodiments of the present invention.

Turning now to FIGS. 5A to 5F, a second example process for forming substantially parallel, substantially co-planar memory lines or rails using a sequential sidewall patterning process according to the present invention is illustrated. FIG. 5A depicts the cross-section of an example stack of layers 500 that may be used to in a double sidewall patterning process of the present invention. As shown, a first template layer 502 is deposited on an etch stop layer 504. The etch stop layer 504 is on a second template layer 506 which is formed on and second etch stop layer 508. The second etch stop layer 508 is formed on an inter-layer dielectric 510. As indicated above, other memory and/or wiring layers may be formed above and below the layer stack 500.

The first and second template layers 502, 506 may be silicon nitride ($Si_3N_4$) or any practicable template material. These layers may be between approximately 50 nm and approximately 500 nm thick. The etch stop layers 504, 508 may be silicon dioxide ($SiO_2$) or any practicable etch stop material and may be between approximately 10 nm and approximately 200 nm thick. In some embodiments, etch stop layers 504, 508 may be optional.

Figure 5B:
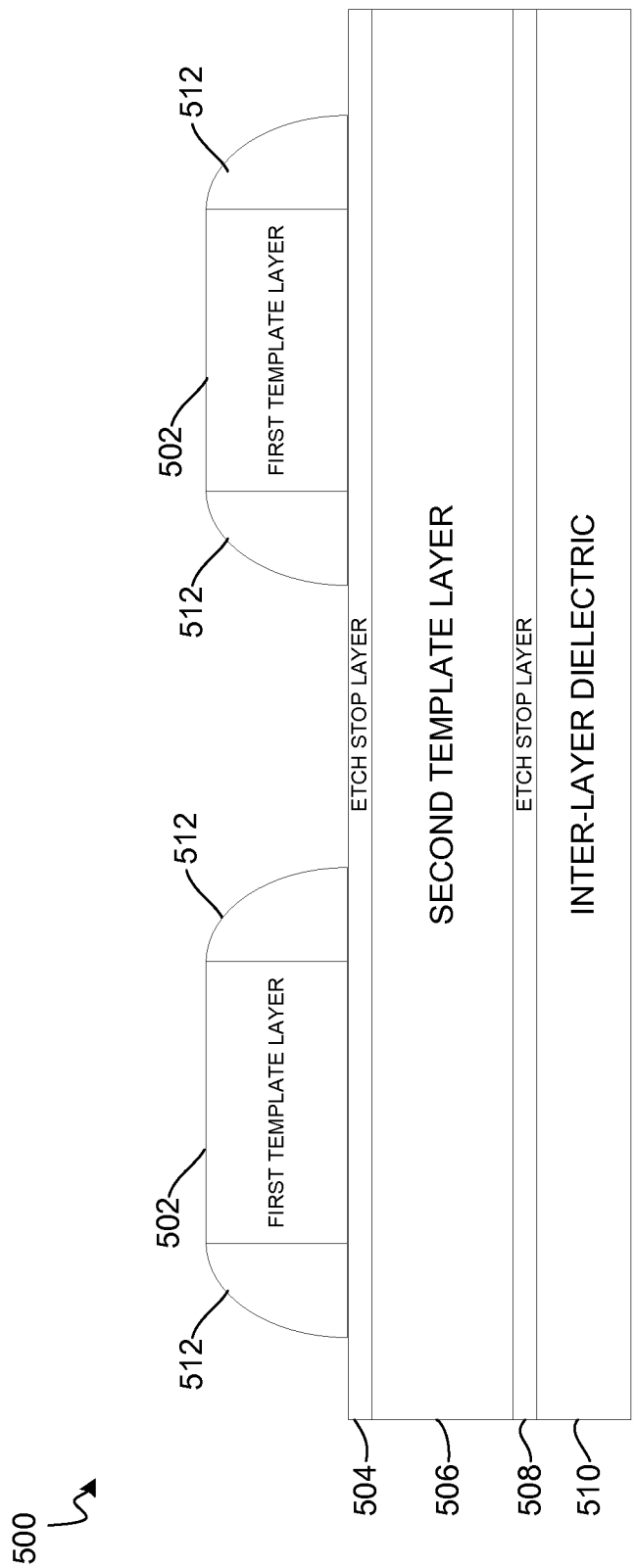
Figure 5C:
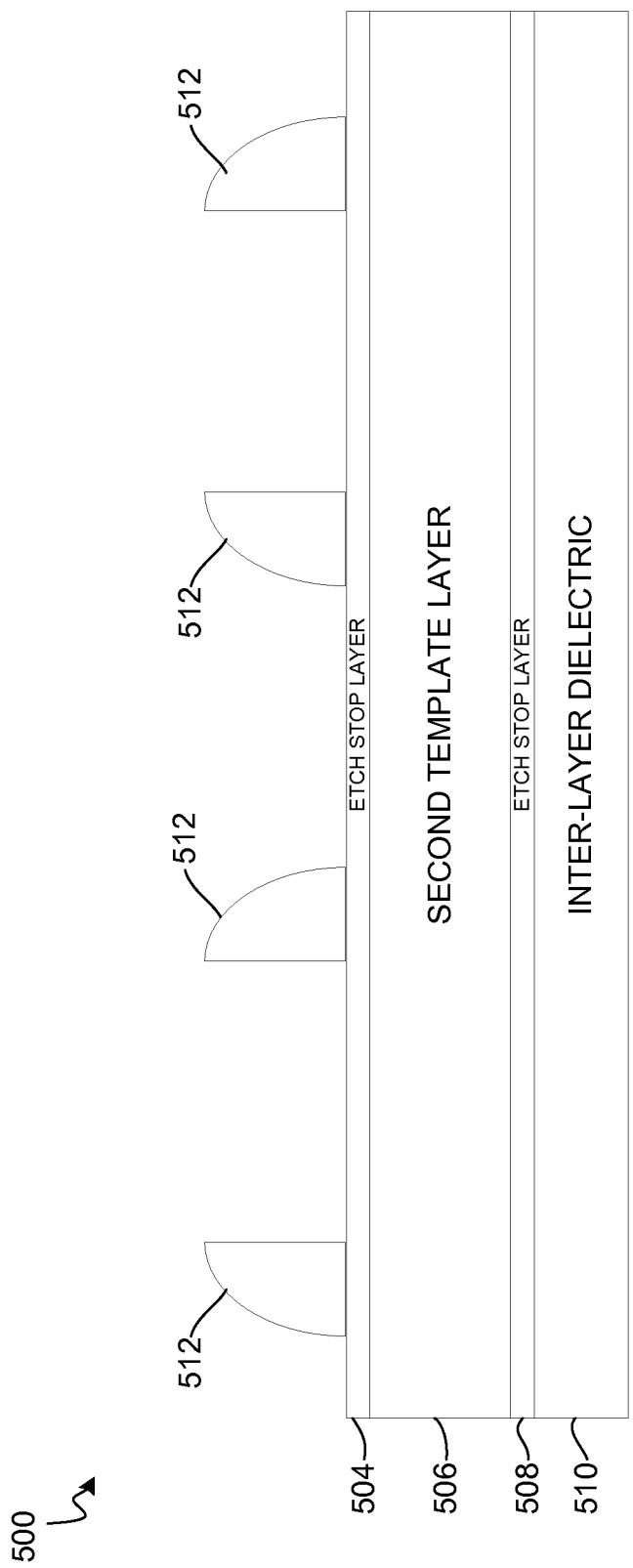

Turning to FIG. 5B, the first template layer 502 is patterned with rails/lines (or other features) using conventional lithography (e.g., 32 nm technology) having the minimum pitch commensurate with the available lithography and patterning technology. The line features shown in FIG. 5B extend into and out of the page, and are shown in cross-section. Next, by depositing a conformal liner of, for example, polysilicon and performing an isotropic etch step, a sidewall hardmask 512 is formed on the sides of the line features patterned in the first template layer 502. The resulting sidewall hardmask 512 includes sidewall spacers on either side of the first template layer 502 line features as shown in FIG. 5B. The sidewall hardmask 512 has a pitch that is smaller than the minimum pitch of the original line pattern, e.g., approximately half the pitch of the original line pattern. The sidewall spacers are separated by spaces having a width greater than one-half the minimum pitch. For example, the ratio of the width of the spaces to the width of the line features 502 may be about 3:1. Polysilicon or any practicable material may be used to form the sidewall hardmask 512. A wet etch process may then be used to remove the remaining first template layer 502 (i.e., the line features) between the sidewall hardmask 512 spacers as shown in FIG. 5C. The etch process may also be used to remove the optional etch stop layer 504 the line features) between the sidewall hardmask 512 spacers. In some embodiments, the second template layer 506 may optionally be $SiO_2$ or have a similar etch rate ratio to the first template layer 502 so that an etch stop layer 504 is not necessary.

Figure 5D:
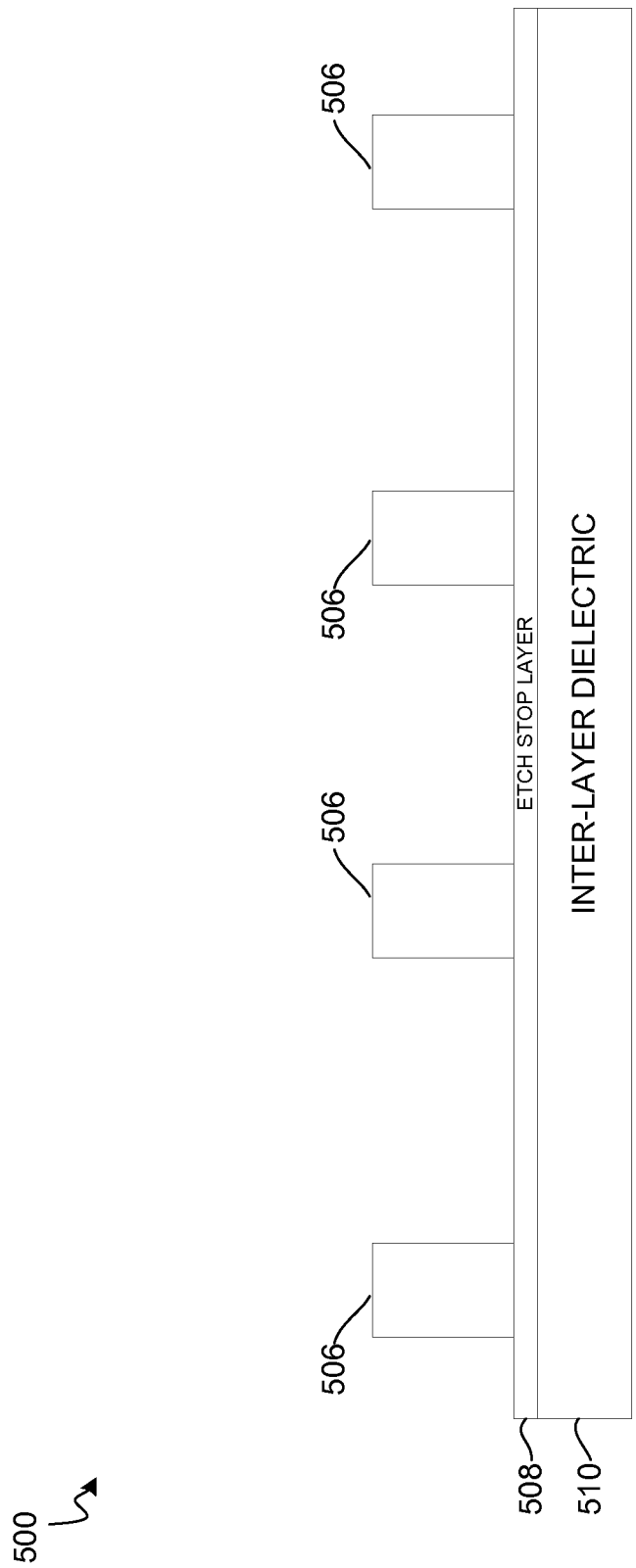
Figure 5E:
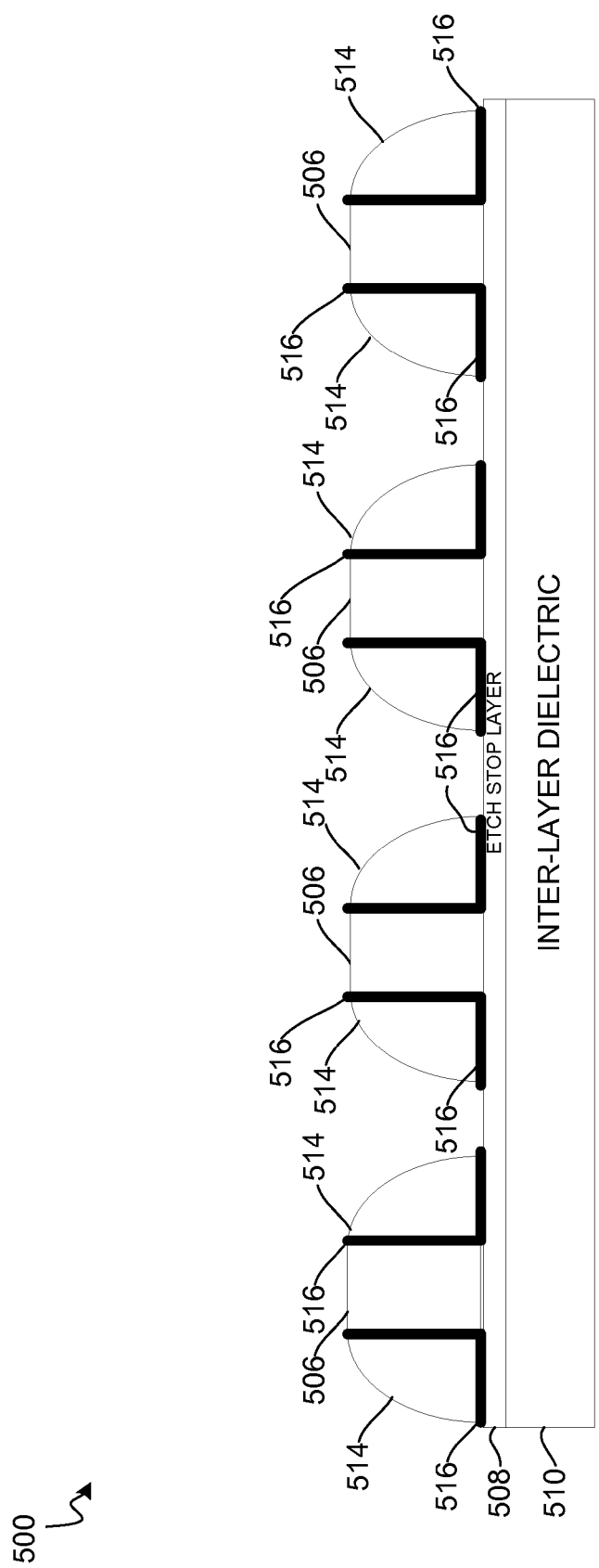

Next, the "half-pitch" sidewall hardmask 512 is used to pattern the second template layer 506 into half-pitch lines as shown in FIG. 5D. For example, a timed etch or an end point detection etch to the second optional etch stop layer 508 may be used. Turning to FIG. 5E, conductive material 514 may be conformally deposited on the line features 506 to form sidewall conductors. Optionally, an adhesion/barrier layer material 516 may be deposited before the conductive material 514. In some embodiments, TiN may be used as the adhesion layer material 516 and W as the conductive material 514. In other embodiments, TaN may be used as the adhesion/barrier layer material 516 and copper (Cu) as the conductive material 514. In such embodiments, the Cu lines may subsequently be coated with electroless TaN using a selective deposition process.

Figure 5F:
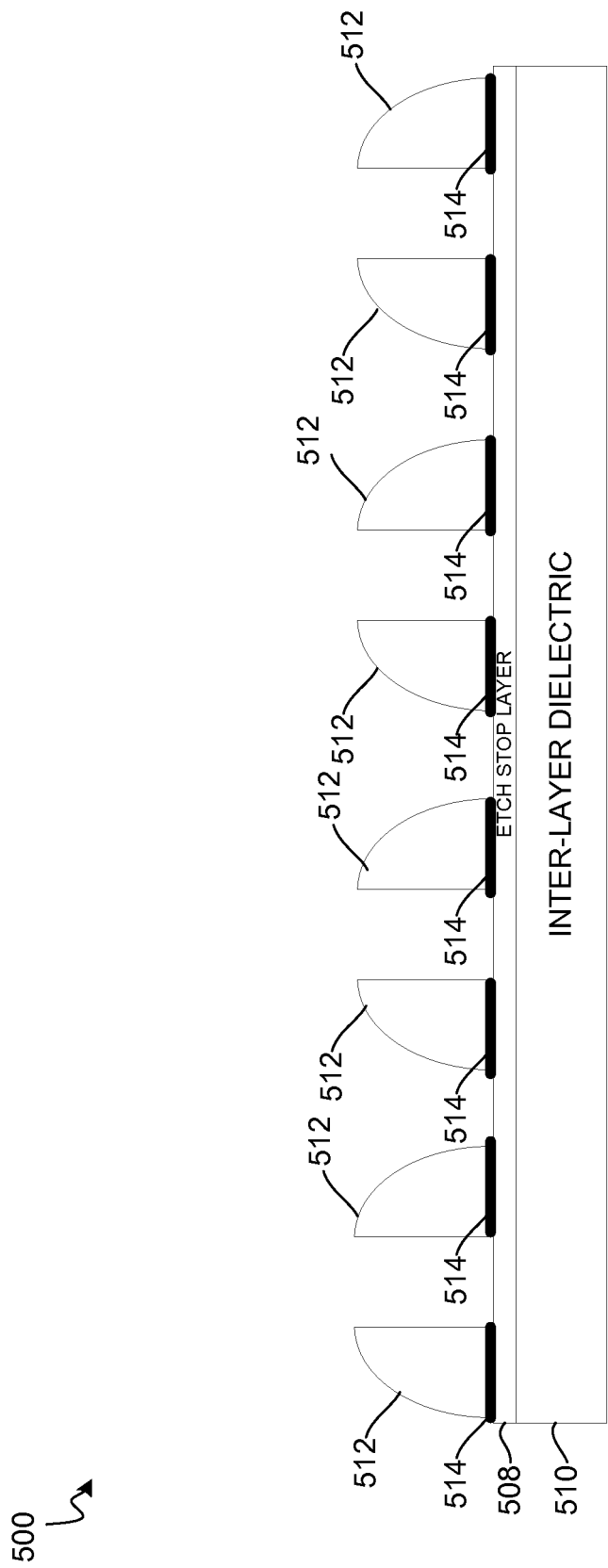

Next, a dielectric material such as $SiO_2$ may be deposited and a planarization process (e.g., chemical mechanical planarization, etch back, etc.) may be used to level the four times HP relief deposited features. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. In some embodiments, the remaining second template layer material 506 may be removed as shown in FIG. 5F and a dielectric gap fill material may then be deposited and planarized.

Persons of ordinary skill in the art will understand that alternative memory structures in accordance with this invention may be fabricated using other similar techniques. For example, memory cells may be formed that include a carbon layer 12 below diode 14.

The foregoing description discloses only exemplary embodiments of the invention. Modifications of the above disclosed apparatus and methods which fall within the scope of the invention will be readily apparent to those of ordinary skill in the art. For instance, in any of the above embodiments, the carbon-based material may be located below the diodes 14. As stated, although the invention has been described primarily with reference to amorphous carbon, other carbon-based materials may be similarly used. Further, each carbon-based layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method of forming a wiring pattern for a memory, comprising:
    forming first features from a first template layer disposed above a substrate;
    forming sidewall spacers adjacent the first features;
    forming second features in a second template layer by using the sidewall spacers as a hardmask;
    forming conductor features by depositing electrically conductive material on sidewalls of the second features;
    depositing a dielectric gap fill material over the conductor features; and
    planarizing the dielectric gap fill material so as to level the conductor features and form the wiring pattern.

2. The method of claim 1, wherein the first features are formed using a lithography apparatus having a minimum pitch capability and wherein the first features are formed with a minimum pitch using the minimum pitch capability of the lithography apparatus.

3. The method of claim 2, wherein the sidewall spacers have a pitch smaller than the minimum pitch.

4. The method of claim 2, wherein the sidewall spacers have a pitch approximately half of the minimum pitch.

5. The method of claim 1, wherein the conductor features have a pitch smaller than a pitch of the sidewall spacers.

6. The method of claim 2, wherein the conductor features have a pitch approximately one-quarter of the minimum pitch.

7. The method of claim 1, further comprising:
    removing the first features prior to forming the second features.

8. A wiring pattern formed according to the method of claim 1.

9. A wiring pattern formed according to the method of claim 2.

10. A wiring pattern formed according to the method of claim 3.

11. A wiring pattern formed according to the method of claim 4.

12. A wiring pattern formed according to the method of claim 5.

13. A wiring pattern formed according to the method of claim 6.

14. A wiring pattern formed according to the method of claim 7.

15. The method of claim 1 further comprising removing the second template layer material prior to depositing the dielectric gap fill material.

16. The method of claim 1 wherein depositing electrically conductive material includes depositing a barrier layer followed by the conductive material.

17. The method of claim 16 wherein the barrier layer includes TiN and the conductive material includes W.

18. The method of claim 16 wherein the barrier layer includes TaN and the conductive material includes Cu.

19. The method of claim 1 wherein the conductive material includes W.

20. The method of claim 1 wherein the conductive material includes Cu.

* * * * *